US012464720B2

(12) United States Patent
Huang

(10) Patent No.: US 12,464,720 B2
(45) Date of Patent: Nov. 4, 2025

(54) MEMORY DEVICE WITH INSULATING PILLAR IN STAIRCASE REGION AND METHOD OF FORMING THE SAME

(71) Applicant: MACRONIX International Co., Ltd., Hsinchu (TW)

(72) Inventor: Chia-Tze Huang, Hsing-Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 376 days.

(21) Appl. No.: 18/302,806

(22) Filed: Apr. 19, 2023

(65) Prior Publication Data

US 2024/0357811 A1     Oct. 24, 2024

(51) Int. Cl.
*H10B 43/27*     (2023.01)
*H01L 23/60*     (2006.01)

(52) U.S. Cl.
CPC ............. *H10B 43/27* (2023.02); *H01L 23/60* (2013.01)

(58) Field of Classification Search
CPC ......... H10B 43/27; H10B 43/10; H10B 43/50
See application file for complete search history.

(56) References Cited

U.S. PATENT DOCUMENTS

| | | | |
|---|---|---|---|
| 2016/0148946 A1* | 5/2016 | Hironaga | H10B 43/27 438/586 |
| 2022/0085150 A1 | 3/2022 | Kwon et al. | |
| 2022/0344267 A1* | 10/2022 | Kim | H10B 43/40 |
| 2022/0352196 A1* | 11/2022 | Shimomura | H10B 41/35 |

FOREIGN PATENT DOCUMENTS

| | | |
|---|---|---|
| CN | 111816660 | 10/2020 |
| CN | 115497977 | 12/2022 |
| TW | 202226548 | 7/2022 |
| TW | 202301652 | 1/2023 |

OTHER PUBLICATIONS

"Office Action of Taiwan Counterpart Application", issued on Oct. 30, 2023, pp. 1-3.

* cited by examiner

*Primary Examiner* — Nduka E Ojeh
(74) *Attorney, Agent, or Firm* — J. C. PATENTS

(57) ABSTRACT

A memory device can be applied to a 3D AND flash memory. The memory device includes a substrate, a first stacked structure, a second stacked structure, a channel structure, an insulating pillar, a through via and a conductive layer. The substrate has a memory array region and a staircase region. The first stacked structure is disposed on the substrate in the memory array region and includes first dielectric layers and gates alternately stacked. The second stacked structure is disposed on the substrate in the staircase region and includes second dielectric layers and stairs alternately stacked. The channel structure penetrates through the first stacked structure in the memory array region. The insulating pillar penetrates through the second stacked structure in the staircase region. The through via penetrates through the insulating pillar in the staircase region. The conductive layer surrounds the sidewall of the insulating pillar.

19 Claims, 13 Drawing Sheets

MEMORY DEVICE WITH INSULATING PILLAR IN STAIRCASE REGION AND METHOD OF FORMING THE SAME

BACKGROUND

Technical Field

The present disclosure relates to a semiconductor device and a method of forming the same, and particularly to a memory device and a method of forming the same.

Description of Related Art

A non-volatile memory device (e.g., a flash memory) has the advantage that stored data does not disappear at power-off, so it becomes a widely used memory device for a personal computer or other electronic equipment.

Currently, the flash memory arrays commonly used in the industry include a NOR flash memory and a NAND flash memory. The NAND flash memory has multiple memory cells connected in series, so the NAND flash memory has better integration and area utilization than the NOR flash memory, and has been widely used in various electronic products. In addition, in order to further enhance the integration of memory devices, a three-dimensional NAND flash memory has been developed. However, there are still many challenges associated with a three-dimensional NAND flash memory.

SUMMARY

The disclosure provides a memory device and a forming method thereof, in which the process can be simplified and the reliability of the formed memory device can be improved.

The present disclosure provides a memory device, which includes a substrate, a first stacked structure, a second stacked structure, a channel structure, an insulating pillar, a through via and a conductive layer. The substrate has a memory array region and a staircase region. The first stacked structure is disposed on the substrate in the memory array region and includes first dielectric layers and gates alternately stacked. The second stacked structure is disposed on the substrate in the staircase region and includes second dielectric layers and stairs alternately stacked. The channel structure penetrates through the first stacked structure in the memory array region. The insulating pillar penetrates through the second stacked structure in the staircase region. The through via penetrates through the insulating pillar in the staircase region. The conductive layer surrounds the sidewall of the insulating pillar.

The present disclosure further provides a method of forming a memory device including the following steps. A substrate is provided. The substrate has a memory array region and a staircase region. A stacked structure is formed on the substrate. The stacked structure includes a plurality of dielectric layers and a plurality of intermediate layers stacked alternately, and the stacked structure in the staircase region has a stepped profile. A channel structure is formed through the stacked structure in the memory array region, and a dummy structure is formed through the stacked structure in the staircase region. A trench is formed through the stacked structure in the memory array region, and a hole is formed through the stacked structure in the staircase region. The plurality of intermediate layers in the memory array region are replaced with a plurality of gates, and the plurality of intermediate layers in the staircase region are replaced with a plurality of stairs. An insulating wall is formed in the trench, and an insulating pillar is formed in the hole.

A through via is formed through the insulating pillar in the staircase region.

Based on the above, the present disclosure provides a memory device and a forming method thereof, in which a trench for a replacement process and a hole for a through via can be simultaneously defined, and the trench and the hole are then filled with a single oxide layer to form an insulating wall and an insulating pillar respectively, and a via is subsequently formed through the insulating pillar. The simultaneous trench/hole definition step described above can simplify the manufacturing process. In addition, the single oxide layer can avoid the conventional short issue between the through via and the underlying interconnection structure caused by incomplete etching during the etching of a through via opening, so the reliability of the formed memory device can be improved.

DESCRIPTION OF THE EMBODIMENTS

Embodiments are described in detail below with reference to the accompanying drawings, but the embodiments are not intended to limit the scope of the present disclosure. In addition, the drawings are for illustrative purposes only and are not drawn to the original dimensions.

Herein, the terms such as "comprising", "including" and "having" are all open-ended terms, i.e., meaning "including but not limited to".

In addition, directional terms such as "on" and "below" mentioned herein are only used to refer to the directions of the drawings and are not used to limit the disclosure. Therefore, it should be understood that "on" may be used interchangeably with "below", and when an element such as a layer or a film is placed "on" another element, the element may be directly disposed on the another element or there may be an intermediate element. On the other hand, when an element is described to be disposed "directly" on another element, there is no intermediate element between them.

FIG. 1 to FIG. 9 are schematic cross-sectional views of a method of forming a memory device in accordance with an embodiment of the present disclosure.

Figure 1:
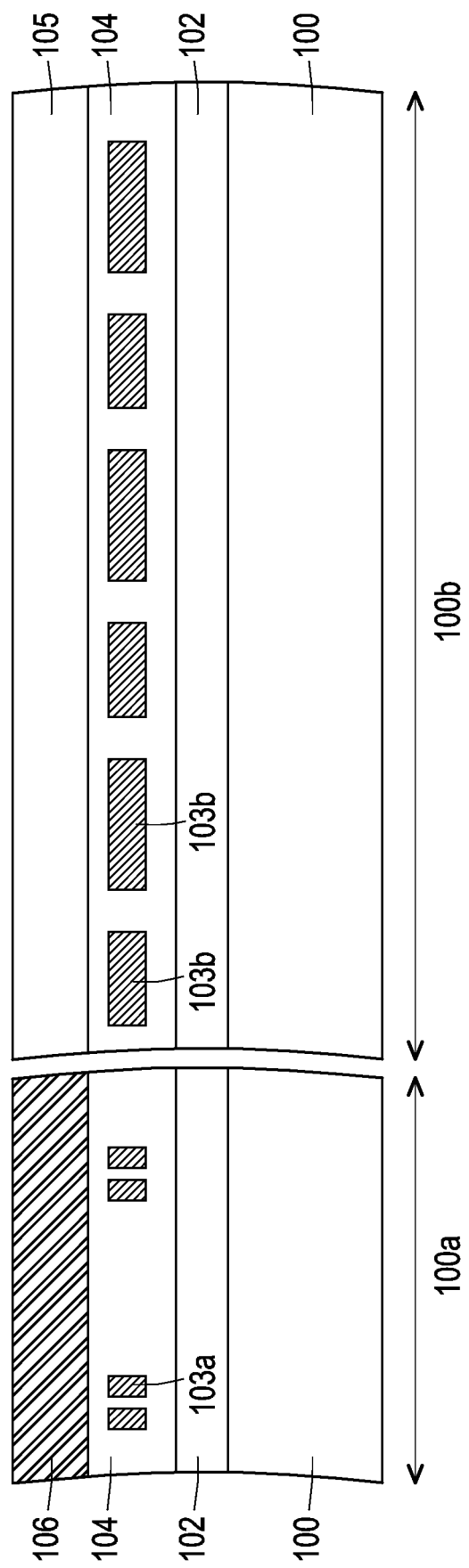
FIG. 1 to FIG. 9 are schematic cross-sectional views of a method of forming a memory device in accordance with an embodiment of the present disclosure.

Referring to FIG. 1, a substrate 100 is provided. In an embodiment, the substrate 100 includes a semiconductor substrate, such as a silicon-containing substrate. The substrate 100 has a memory array region 100a and a staircase region 100b. Then, a device layer 102 is formed on the substrate 100. In an embodiment, the device layer 102 may include various well-known semiconductor devices. In an embodiment, the device layer 102 may include a metal oxide semiconductor (MOS) transistor formed at the surface of the substrate 100, and an interconnection structure electrically connected to the metal oxide semiconductor transistor, but the present disclosure is not limited thereto. The interconnection structure includes multiple dielectric layers and multiple interconnection layers in the dielectric layers. In other embodiments, the device layer 102 may further include other semiconductor devices known to those skilled in the art. In addition, the forming method of the device layer 102 is well known to those skilled in the art and is not described herein.

Then, an insulating layer 104 is formed on the device layer 102. In an embodiment, the insulating layer 104 has a plurality of separate stop patterns 103a and 103b. More specifically, the stop patterns 103a are formed within the insulating layer 104 in the memory array region 100a, and the stop patterns 103b are formed within the insulating layer 104 in the staircase region 100b. In an embodiment, the stop patterns 103a and 103b are embedded in the insulating layer 104 and surrounded by the insulating layer 104. In an embodiment, the insulating layer 104 includes silicon oxide, and the stop patterns 103a and 103b include polysilicon. However, the present disclosure is not limited thereto. Depending on the actual situation, in other embodiments, the stop patterns can be continuously formed across the memory array region 100a and the staircase region 100b to form a sandwich structure including a lower insulating layer, a middle stop layer, and an upper insulating layer. The method of forming the insulating layer 104 and the stop patterns 103a and 130b are well known to those skilled in the art and is not described herein.

Next, a ground layer 106 is formed on the insulating layer 104 in the memory array region 100a and an isolation layer 105 is formed on the insulating layer 104 in the staircase region 100b. The ground layer 106 can be used to conduct the charges generated in the subsequent process to the substrate 100. In an embodiment, the ground layer 106 includes a polysilicon layer, and the isolation layer 105 includes a silicon oxide layer, but the disclosure is not limited thereto. In other embodiments, the ground layer 106 can be another conductive layer, such as a metal layer. Depending on the actual situation, in other embodiments, the isolation layer 105 can be omitted, and the ground layer 106 can be continuously formed across the memory array region 100a and the staircase region 100b. When the ground layer 106 is continuously formed across the memory array region 100a and the staircase region 100b, the formation of the stop patterns may be optionally omitted as needed.

Figure 2:
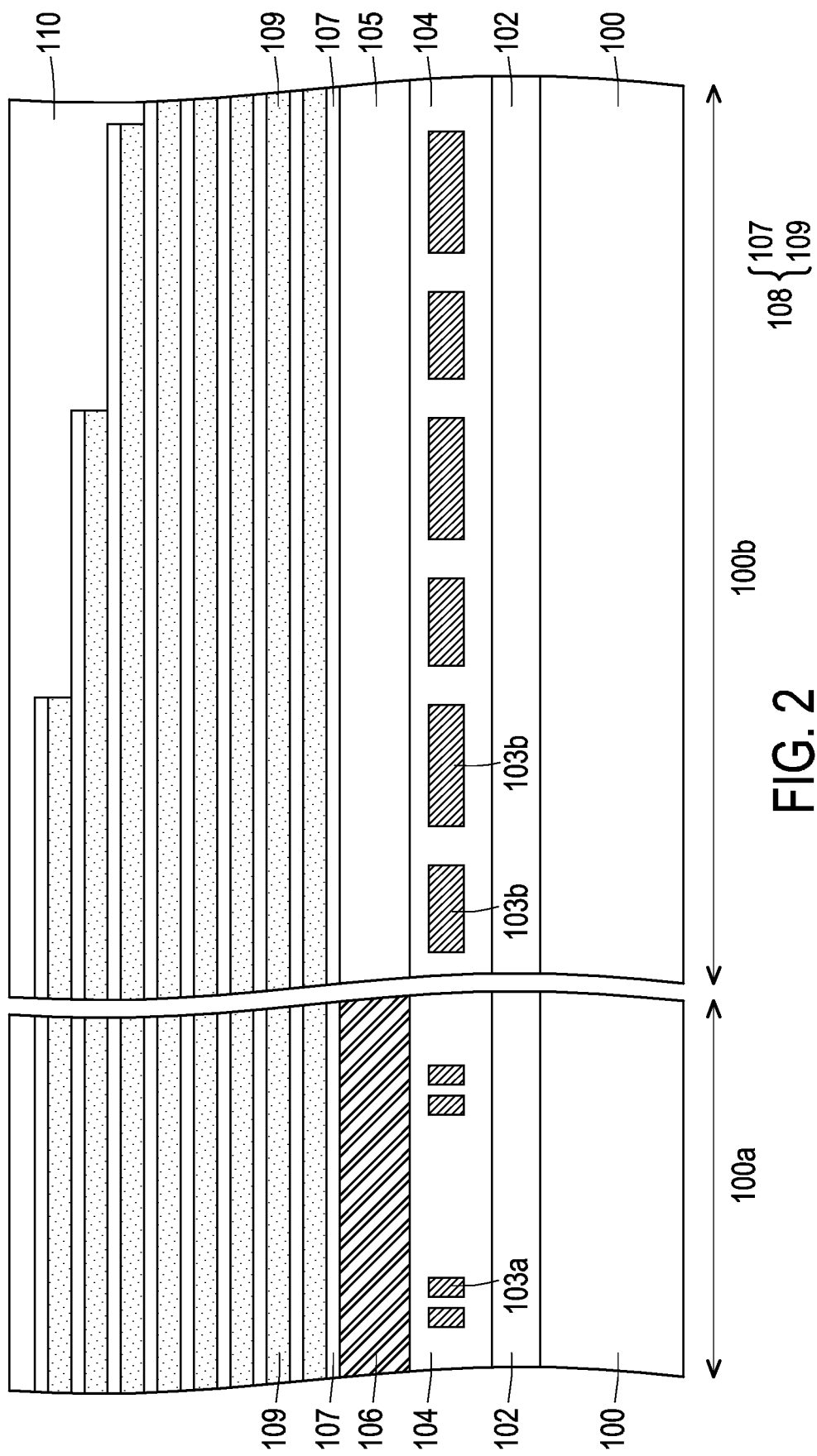

Referring to FIG. 2, a stacked structure 108 is formed on the ground layer 106 and the isolation layer 105. In an embodiment, the stacked structure 108 includes a plurality of dielectric layers 107 and a plurality of intermediate layers 109 alternately stacked on the substrate 100. The present disclosure does not limit the number of the dielectric layers 107 and the intermediate layers 109. In an embodiment, each dielectric layer 107 includes an oxide layer, and each intermediate layers 109 includes a nitride layer, but the disclosure is not limited thereto. In another embodiments, the dielectric layers 107 and the intermediate layers 109 can be other dielectric material layers, as long as there is an etching selectivity between the dielectric layers 107 and the intermediate layers 109. In an embodiment, the intermediate layers 109 serve as sacrificial layers that are subjected to a subsequent replacement step. In another embodiment, the intermediate layers 109 are doped polysilicon layers without a replacement step. In addition, in the staircase region 100b, the stacked structure 108 has a stepped profile. The method of forming the stacked structure 108 with a stepped profile is well known to those skilled in the art and is not be described herein.

Then, a cap layer 110 is formed on the stacked structure 108. The cap layer 110 covers the stacked structure 108 and has a flat top surface. In an embodiment, the cap layer 110 includes an oxide layer, but the disclosure is not limited thereto. The forming method of the cap layer 110 includes forming a cap material layer on the stacked structure 108, and then performing a planarization process, such as a chemical mechanical polishing (CMP) process.

Figure 3:
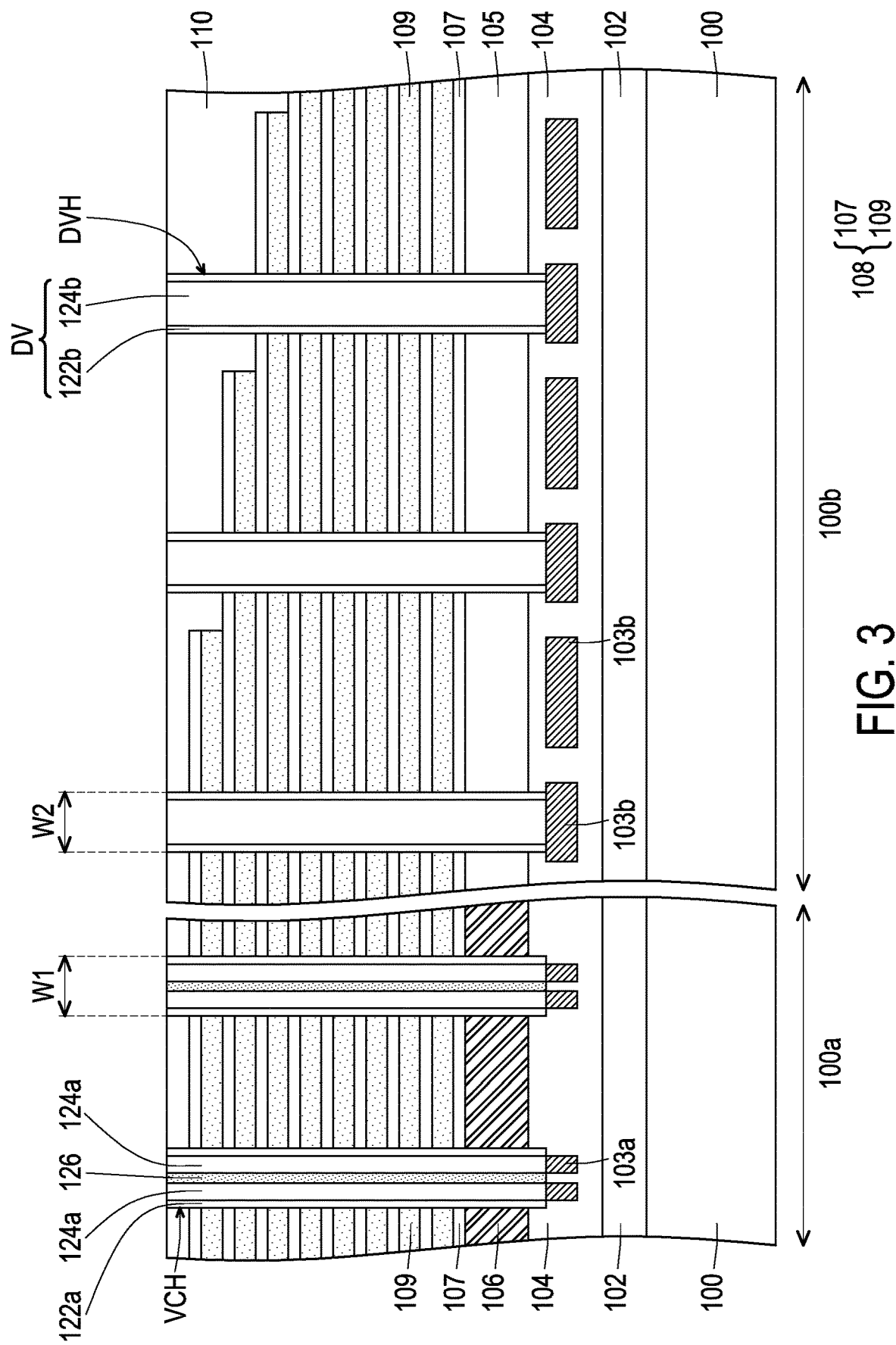
Figure 4:
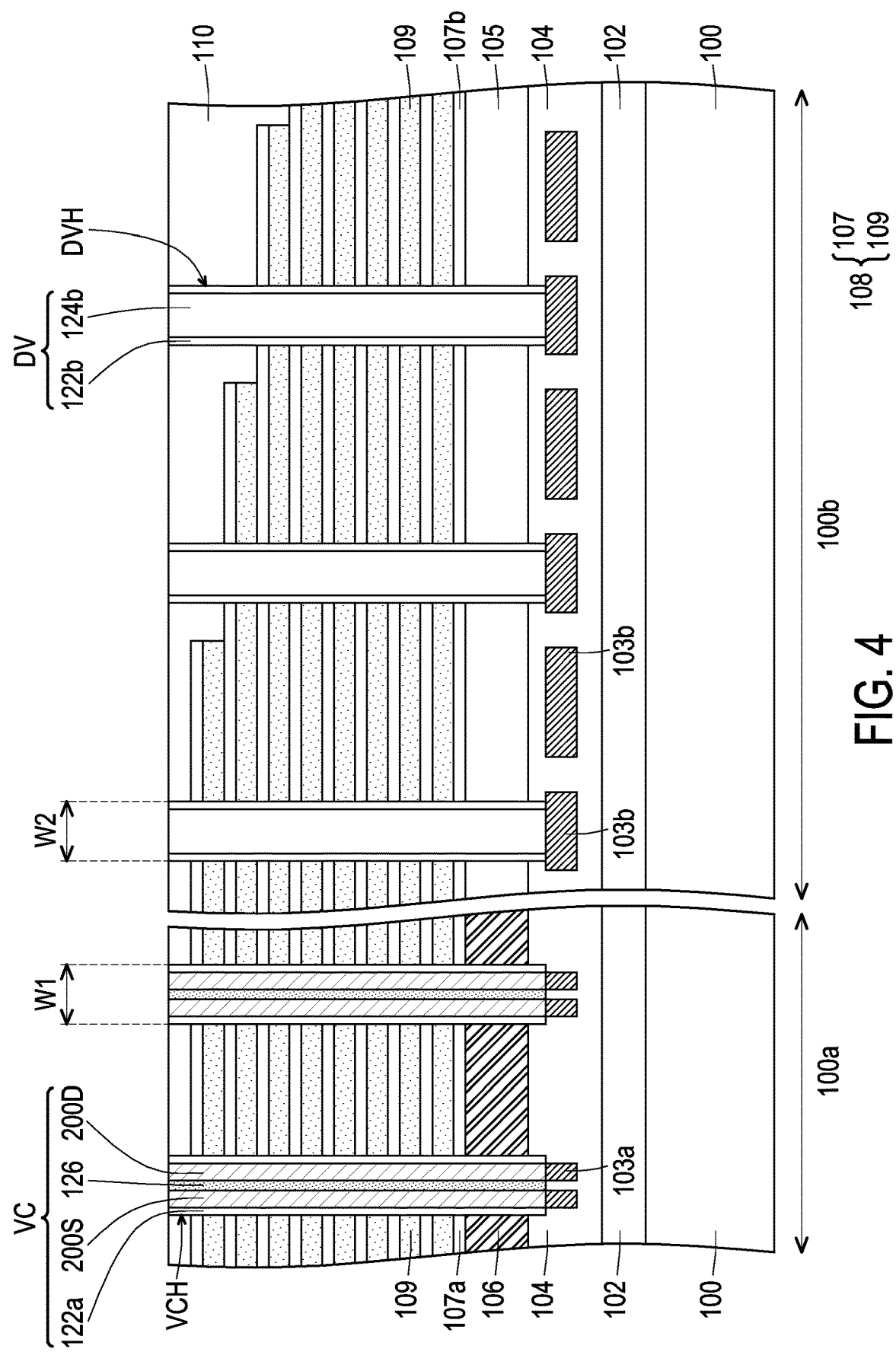

Referring to FIG. 3 and FIG. 4, a channel structure VC is formed through the stacked structure 108 in the memory array region 100a, and a dummy structure DV is formed through the stacked structure 108 in the staircase region 100b.

Figure 10:
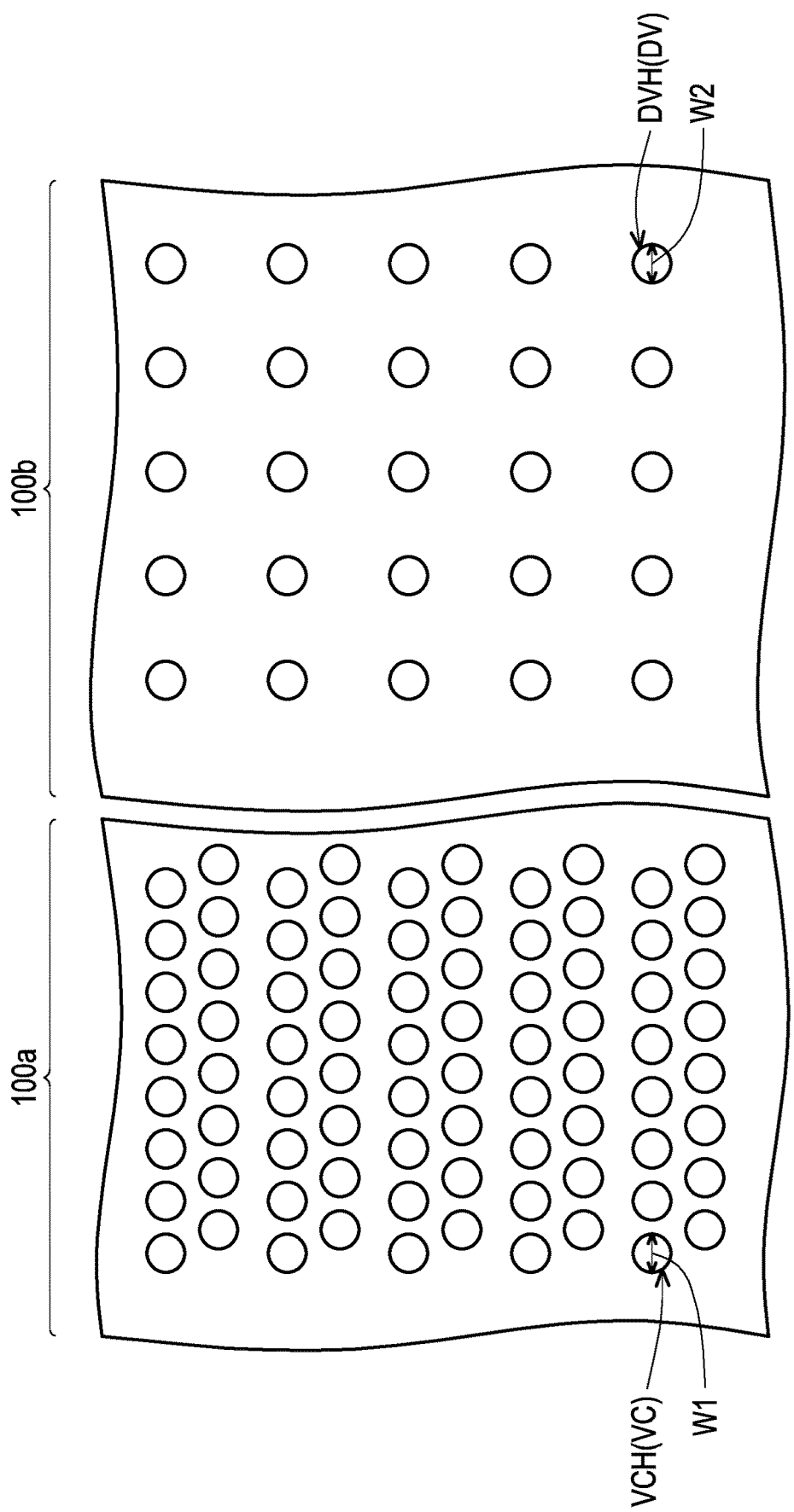
FIG. 10 to FIG. 13 are simplified top views in some stages of forming various memory devices in accordance with some embodiments of the present disclosure.
Figure 12:
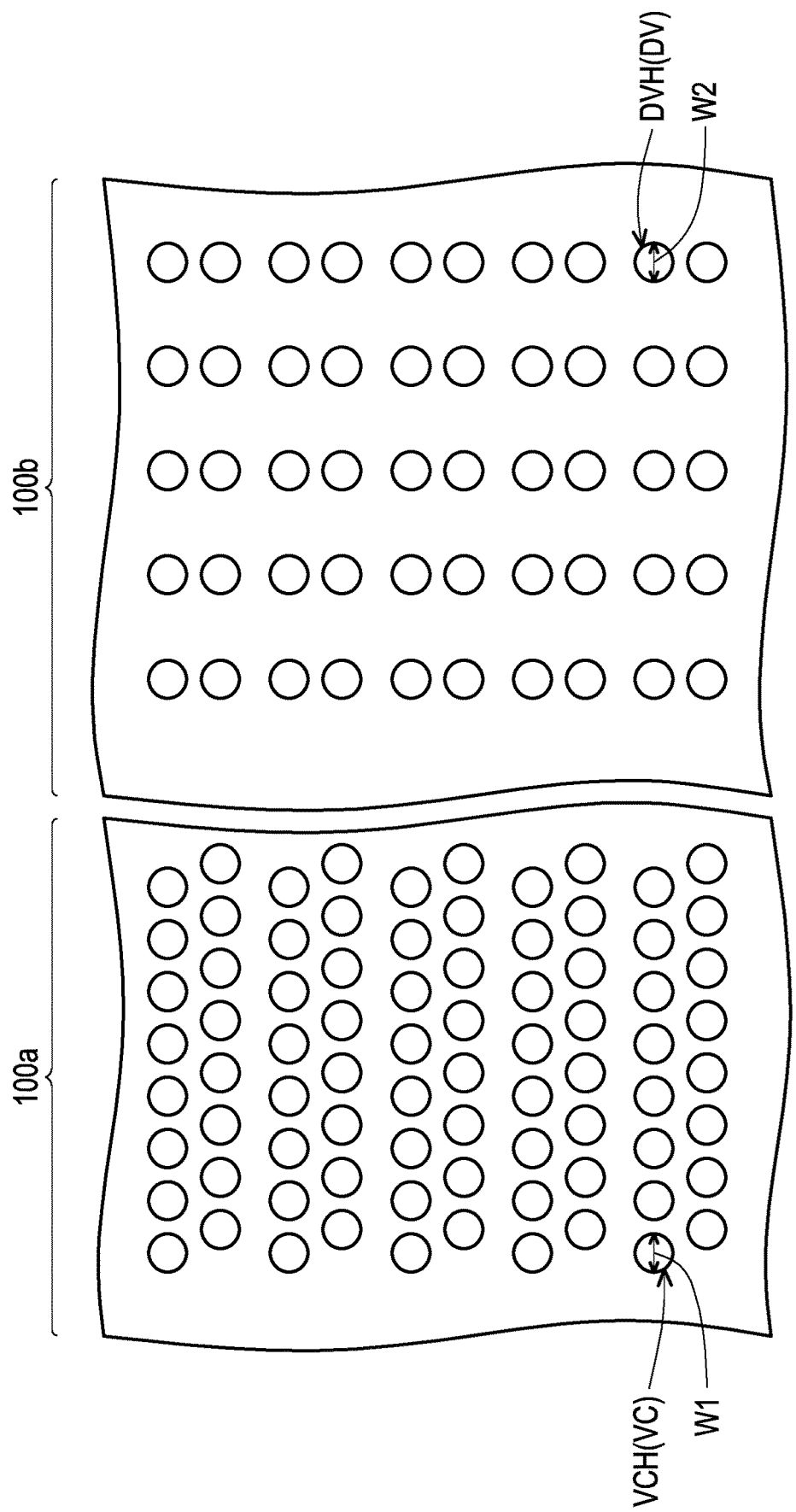

In an embodiment, as shown in FIG. 3, a channel structure hole VCH is formed through the stacked structure 108 in the memory array region 100a, and a dummy structure hole DVH is formed through the stacked structure 108 in the staircase region 100b. The method of forming channel structure hole VCH and dummy structure hole DVH includes lithography and etching processes. In an embodiment, the channel structure hole VCH and the dummy structure hole DVH can be defined by the same photomask, as shown in FIG. 10 or FIG. 12. The process of etching channel structure hole VCH and the dummy structure hole DVH uses the underlying stop patterns 103a and 103b as etching stop layers.

The channel structure hole VCH has a dimension W1, and the dummy structure hole DVH has a dimension W2. In an embodiment, the dimension W1 is substantially equal to the dimension W2. The step of forming the channel structure hole VCH is a critical process. When single-dimension holes VCH and DVH are formed in the memory array region 100a and the staircase region 100b, the process window of the channel structure hole can be increased. However, the present disclosure is not limited thereto. In another embodiment, the dimension W1 is different from the dimension W2. For example, when the dimension W2 is greater than the dimension W1, the subsequently formed dummy structure can provide better structural support for the staircase region.

Thereafter, a semiconductor layer 122a is formed on the sidewall of the channel structure hole VCH, and a semiconductor layer 122b is formed on the sidewall of the dummy structure hole DVH. In an embodiment, the semiconductor layer 122a serves as a channel layer of the memory array. The method of forming the semiconductive layers 122a and 122b includes conformally forming a semiconductor material layer on the cap layer 110 filling in the channel structure hole VCH and the dummy structure hole DVH, and then performing an anisotropic etching process to remove part of the semiconductor material layer. In an embodiment, the semiconductor material layer includes a polysilicon layer, such as an undoped polysilicon layer.

Continue referring to FIG. 3, an isolation pillar 124a fills in the channel structure hole VCH, and an isolation pillar 124b fills in the dummy structure hole DVH. The forming method of the isolation pillar 124a and the isolation pillar 124a includes forming an isolation material layer on the cap layer 110 filling in the channel structure hole VCH and dummy structure hole DVH, and then performing a planarization process to remove the isolating material layer outside of the channel structure hole VCH and dummy structure hole DVH. In an embodiment, the isolation material layer includes a silicon oxide layer.

A dielectric pillar 126 is then formed in isolation pillar 124a. The method of forming the dielectric pillar 126 includes forming a hole in the isolation pillar 124a by photolithography and etching processes, forming a dielectric material layer on the cap layer 110 filling in the hole, and then performing a planarization process to remove the dielectric material layer outside the hole. In an embodiment, the dielectric material layer includes a silicon nitride layer.

In another embodiment, when the dimension W1 of the channel structure hole VCH is greater than the dimension W2 of the dummy structure hole DVH, the above isolation material layer merely fills up the dummy structure hole DVH, without filling up the channel structure hole VCH, and then a dielectric material layer fills up the channel structure hole VCH to form the above structure.

Referring to FIG. 4, a source pillar 200S and a drain pillar 200D are formed in the isolation pillar 124a, wherein the source pillar 200S and the drain pillar 200D are separated each other by the dielectric pillar 126. The method of forming the source pillar 200S and the drain pillar 200D includes forming two holes in each isolation pillar 124a, and the process of etching the holes uses the underlying stop patterns 103a as etching stop layers. Next, a conductive layer is formed on the cap layer 110 filling in the holes, and then a planarization process is performed to remove the conductive layer outside the holes. In an embodiment, the conductive layer includes a doped polysilicon layer. In an embodiment, a vertical channel structure VC includes a semiconductor layer 122a as a channel layer, a dielectric pillar 126, and a source pillar 200S and a drain pillar 200D.

Figure 5:
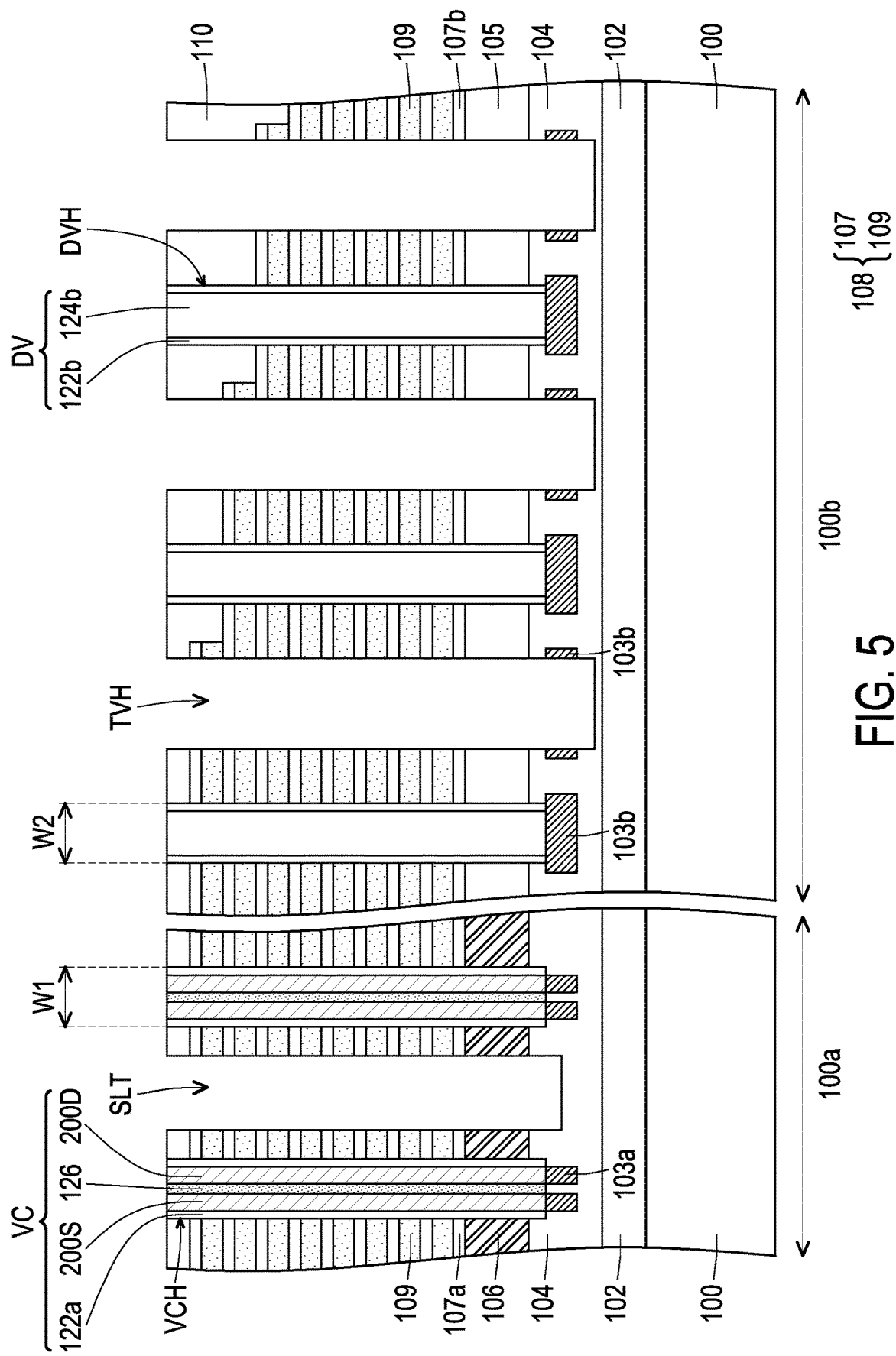
Figure 11:
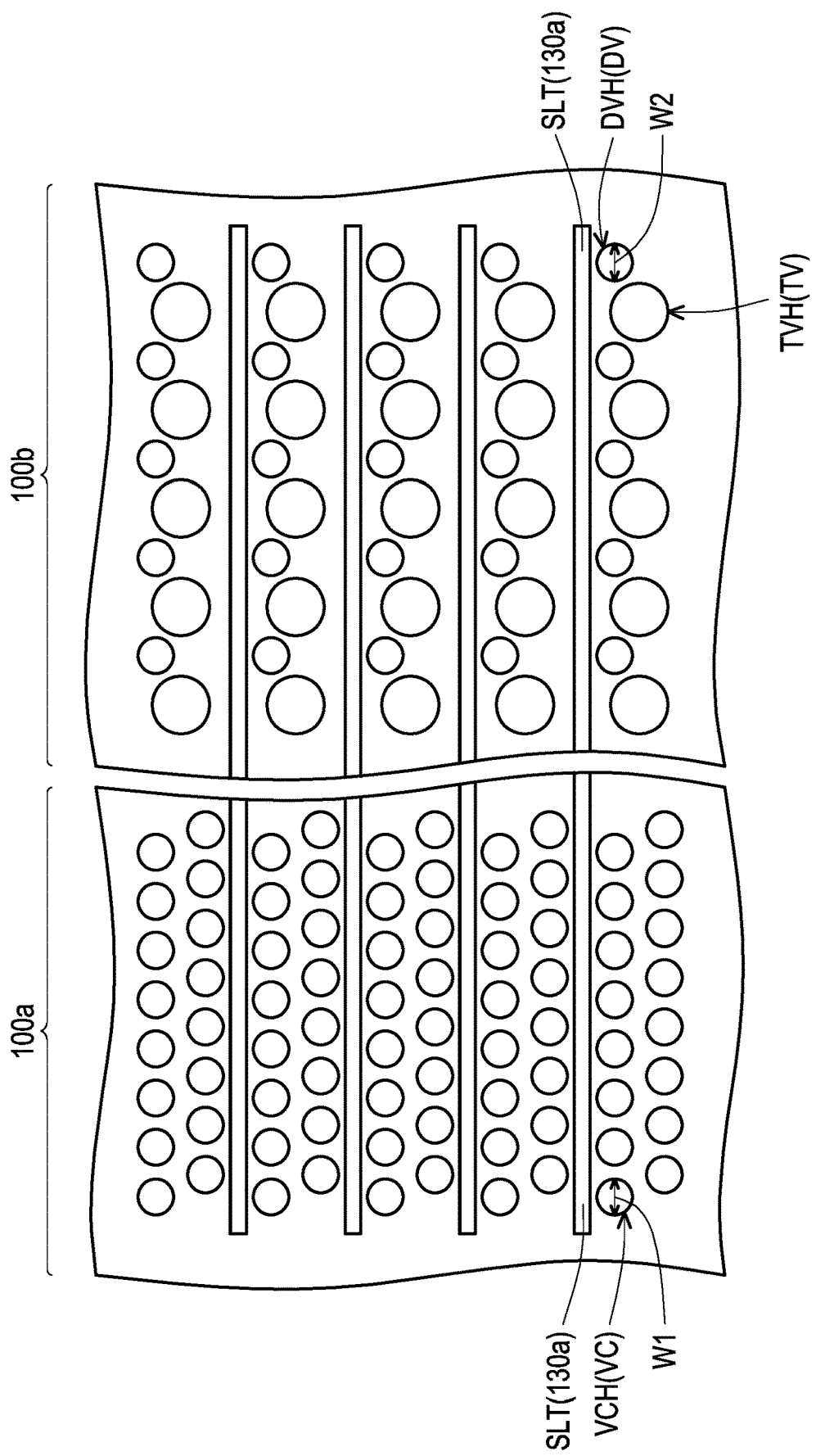
Figure 13:
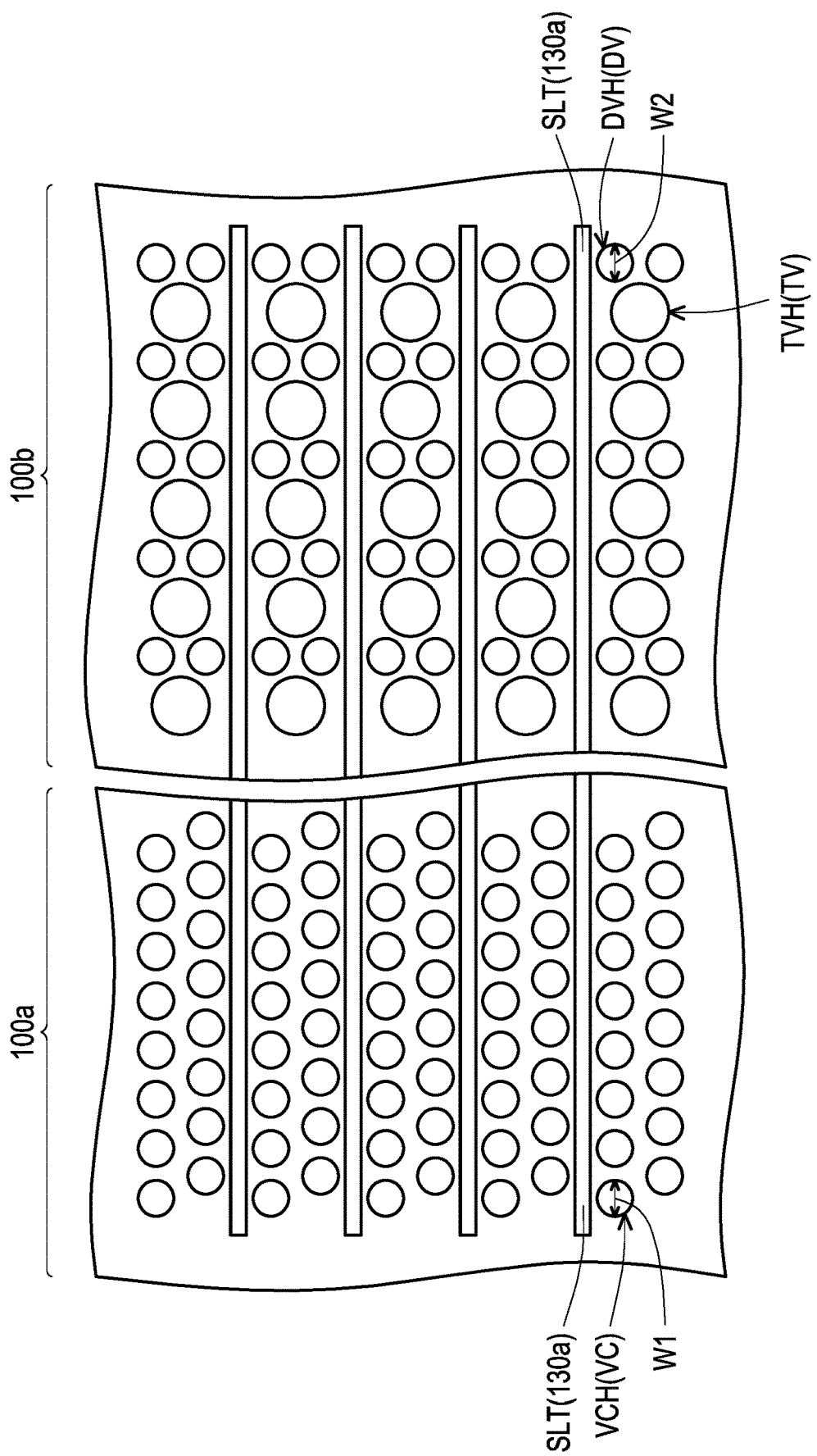

Referring to FIG. 5, a trench SLT (or called a "slit" in some examples) is formed through the stacked structure 108 in the memory array region 100a, and a hole TVH is formed through the stacked structure 108 in the staircase region 100b. More specifically, the trench STL is formed across the memory array region 100a and the staircase region 100b, as shown in FIG. 11 or FIG. 13. The method of forming trench SLT and hole TVH includes lithography and etching processes. In an embodiment, trench SLT and hole TVH can be defined by the same photomask, as shown in FIG. 11 or FIG. 13. In an embodiment, the trench SLT can penetrate through the ground layer 106 and extend into a portion of the insulating layer 104. In an embodiment, the hole TVH can penetrate through the isolation layer 105 and the corresponding stop pattern 103b. More specifically, the hole TVH can extend into the insulating layer 104 below the corresponding stop pattern 103b, but does not penetrate through the insulating layer 104. The trench SLT and hole TVH expose the dielectric layers 108 and intermediate layers 109 of the stacked structure 108.

In an embodiment, the dimension of the hole TVH is greater than the dimension of the dummy structure hole DVH, as shown in FIG. 11 and FIG. 13, but the present disclosure is not limited thereto. In another embodiment, the dimension of the hole TVH may be equal to or less than the dimension of the dummy structure hole DVH due to process requirements.

Figure 6:
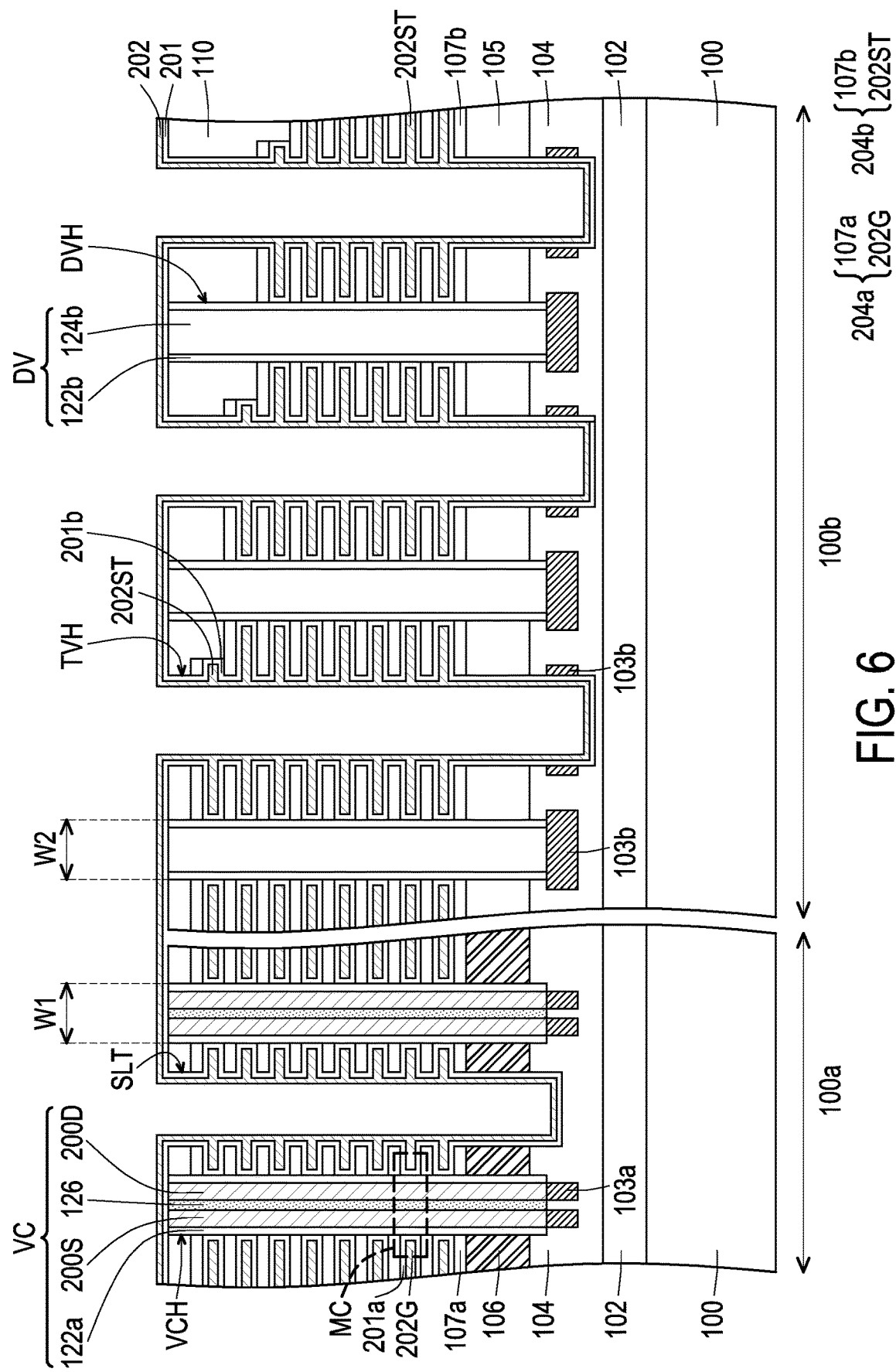

Referring to FIG. 6, the multiple intermediate layers 109 in the memory array region 100a and the staircase region 100b are replaced with multiple gates 202G and multiple stairs 202ST. More specifically, after the replacement process, the stacked structure 204a in the memory array region 100a includes multiple dielectric layers 107a and multiple gates 202G alternately stacked on the substrate 100, and the stacked structure 204b on the staircase region 100b includes multiple dielectric layers 107b and multiple stairs 202ST alternately stacked on the substrate 100. In an embodiment, when the intermediate layers 109 are doped polysilicon layers, the above replacement step can be optionally omitted.

In an embodiment, a selective etching process is performed, and the etchant contacts the intermediate layers 109 of the stacked structure 108 exposed by the trench SLT and the hole TVH, and thus, the intermediate layers 109 of the stacked structure 108 are etched and removed to form multiple horizontal openings (not shown). The selective etching process can be an isotropic etching process, such as a wet etching process. The etchant used in the wet etching process includes hot phosphoric acid. Then, a composite dielectric layer 201 and a conductive layer 202 are sequentially formed in the trench SLT, the hole TVH and the horizontal openings.

In an embodiment, the composite dielectric layer 201 and the conductive layer 202 cover the surface of the cap layer 110, the sidewall and bottom of the trench SLT, the sidewall and bottom of the hole TVH and fill up the horizontal openings. In an embodiment, the composite dielectric layer 201 includes an oxide/nitride/oxide (ONO) composite layer. In an embodiment, the conductive layer 202 includes a barrier layer and a metal layer. In an embodiment, the material of the barrier layer includes titanium (Ti), titanium nitride (TiN), tantalum (Ta), tantalum nitride (TaN) or a combination thereof. The material of the metal layer includes tungsten (W).

The composite dielectric layer 201 in the memory array region 100a serves as a charge storage structure 201a, and the composite dielectric layer 201 in the staircase region 100b serves as a stair protection layer 201b of the stairs 202ST. The conductive layer 202 in the memory array region 100a forms multiple gates 202G, and the conductive layer 202 in the staircase region 100b forms multiple conductive stairs 202ST. In an embodiment, each memory cell MC in the memory array includes a gate 202G, a charge storage structure 201a, a semiconductor channel layer 122a, a source pillar 200S, and a drain pillar 200D.

Figure 7:
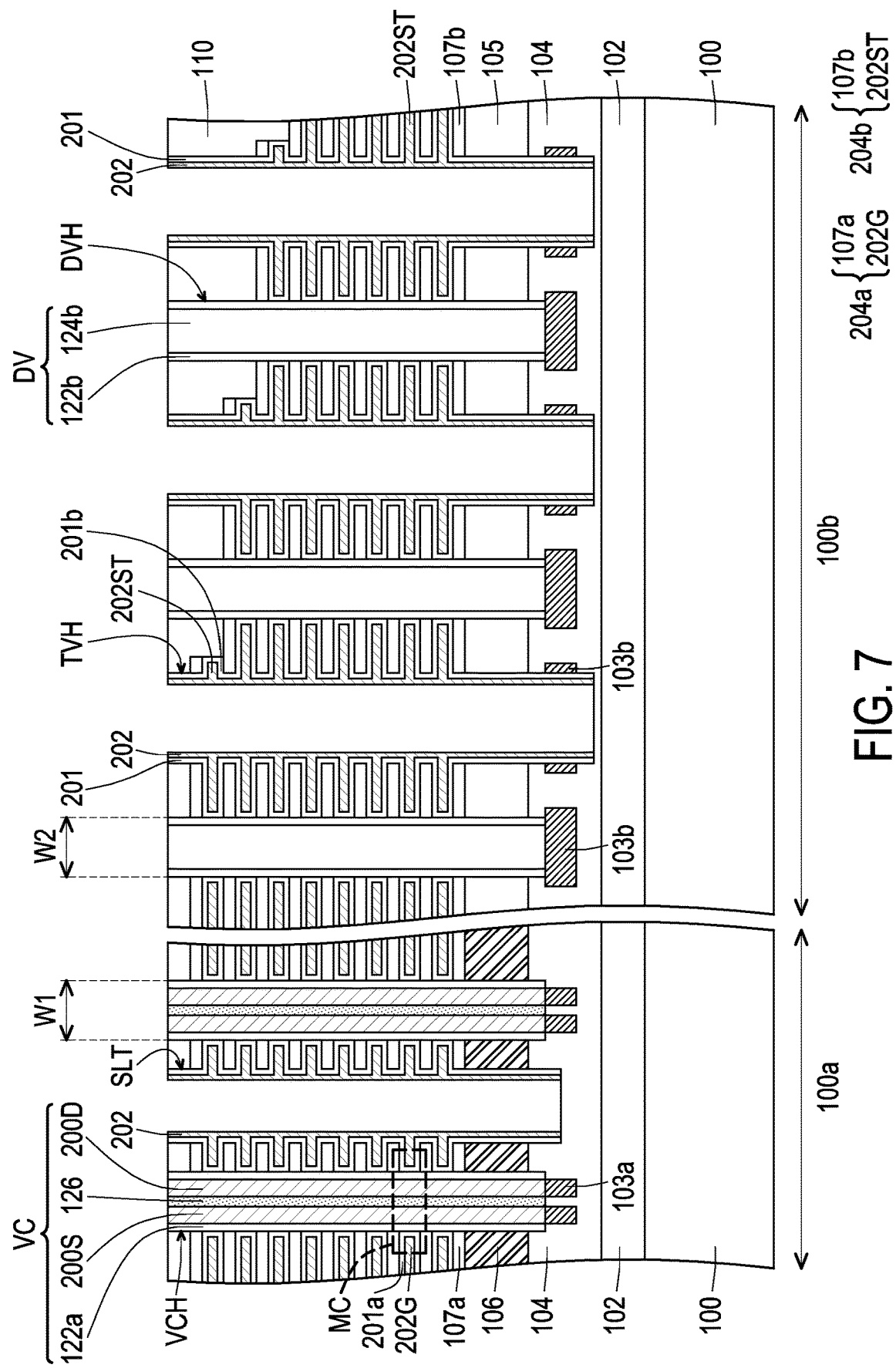

Referring to FIG. 7, an etching back process is performed to remove the conductive layer 202 on the surface of the cap layer 110, on the bottom of the trench SLT and on the bottom of the hole TVH. The remaining conductive layer 202 is disposed on the sidewall of the of the trench SLT and on the sidewall of the hole TVH. In an embodiment, the etching back process includes an anisotropic etching process.

Figure 8:
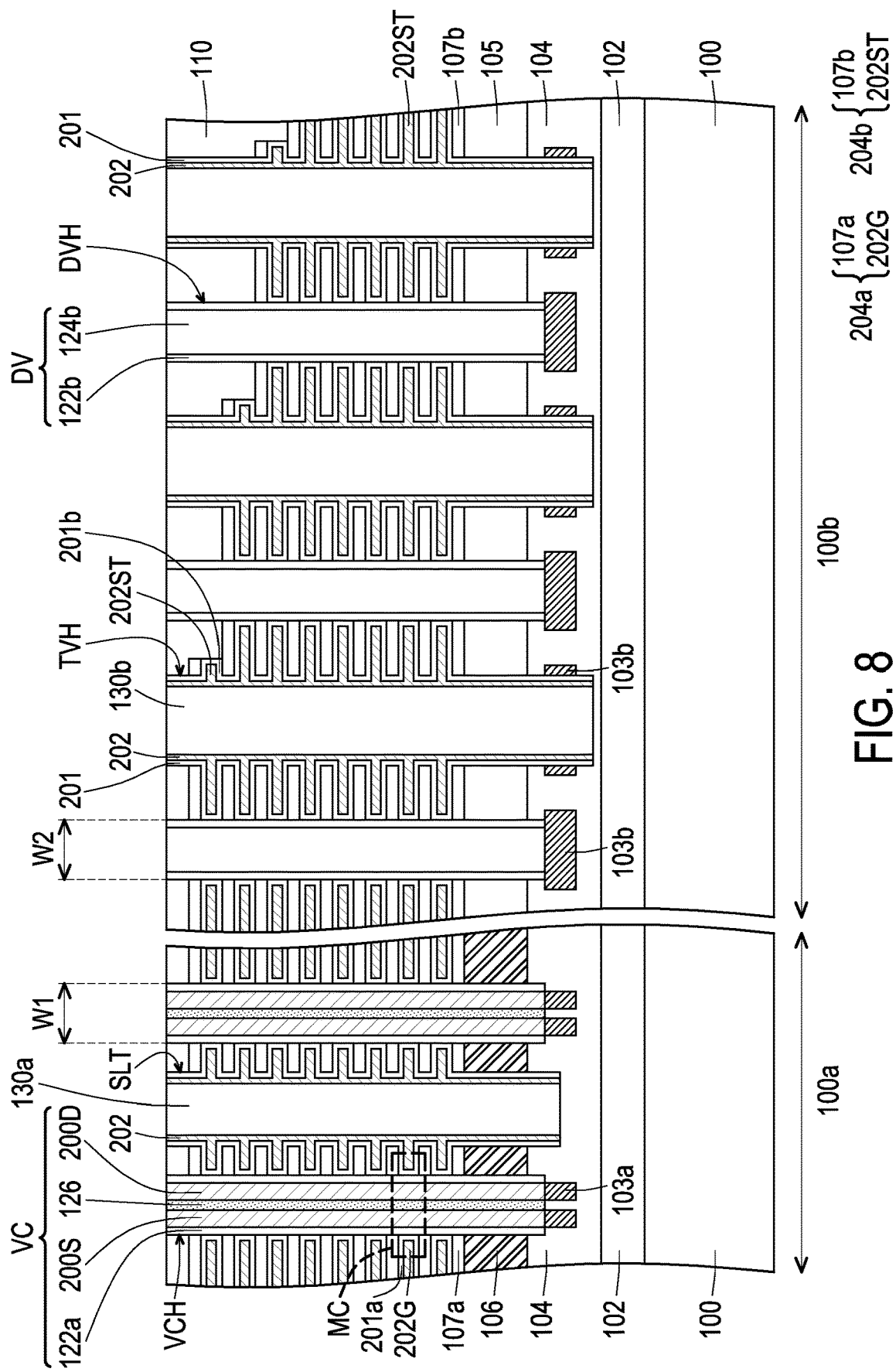

Referring to FIG. 8, an insulating wall 130a is formed in the trench SLT, and an insulating pillar 130b is formed in the hole TVH. The method of forming the insulating wall 130a and the insulating pillar 130b includes forming an insulating material layer on the cap layer 110 filling in the trench SLT and hole TVH, and then performing a planarization process to remove the insulating material layer outside the trench SLT and hole TVH. In an embodiment, the insulating material layer includes a silicon oxide layer, such as a low temperature silicon oxide layer. More specifically, the insulating material layer is a single oxide layer.

Figure 9:
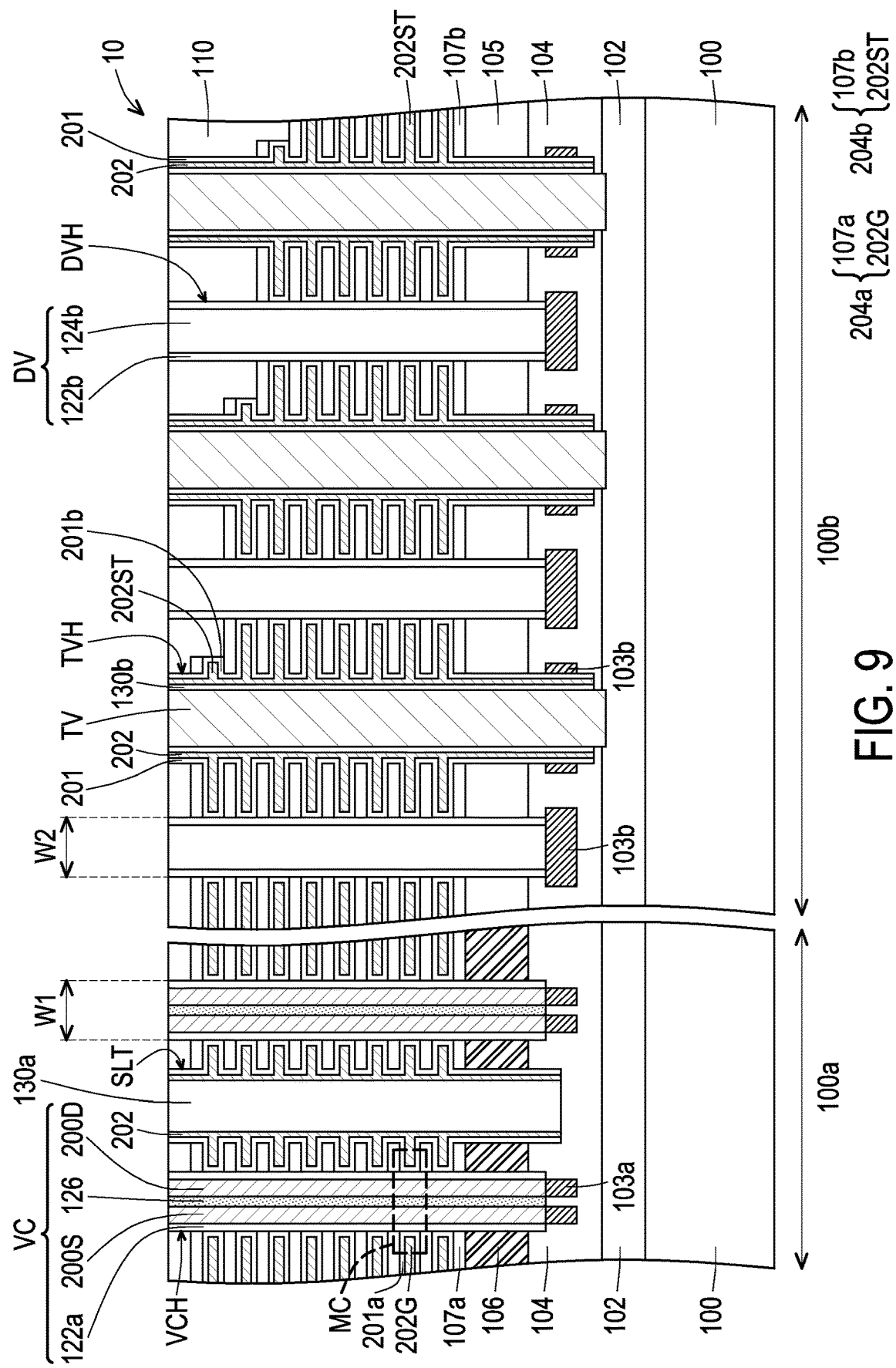

Referring to FIG. 9, a through via TV is formed in the staircase region 100b, and the through via TV penetrates through the insulating pillar 130b in the hole TVH. The method of forming the through via TV includes forming a through via opening in each insulating pillar 130b, filling in the through via opening with a conductive layer, and then performing a planarization process to remove the conductive layer outside the hole. Since the insulating pillar 130b has a single oxide layer, it can avoid the conventional short issue between the through via and the underlying interconnection structure caused by incomplete etching during the etching of a through via opening, so the reliability of the formed memory device can be improved. In an embodiment, the conductive layer includes tungsten. The above-mentioned hole penetrates through the insulating layer 104 and extends into part of device layer 102. More specifically, the through via TV may be landed on a top metal layer (not shown) of the interconnection structure of device layer 102. The through via TV is connected to the interconnection structure, so it can also be called a signal contact. The memory structure 10 of the present disclosure is thus formed.

Hereinafter, the memory device of the present disclosure will be described with reference to FIG. 9, FIG. 11 and FIG. 13. In an embodiment, the memory device 10 includes a substrate 100, a stacked structure 204a, a stacked structure 204b, a channel structure VC, an insulating pillar 130b, and a through via TV. The substrate 100 has a memory array region 100a and a staircase region 100b. The stacked structure 204a is disposed on the substrate 100 in the memory array region 100a, and the stacked structure 204a includes a plurality of dielectric layers 107a and a plurality of gates 202G stacked alternately. The stacked structure 204b is disposed on the substrate 100 in the staircase region 100b, and the stacked structure 204b includes a plurality of dielectric layers 107b and a plurality of stairs 202ST stacked alternately. The channel structure VC penetrates through the stacked structure 204a in the memory array region 100a. The insulating pillar 130b penetrates through the stacked structure 204b in the staircase region 100b. The through via TV penetrates through the insulating pillar 130b in the staircase region 100b. The conductive layer 202 surrounds the sidewall of the insulating pillar 130b. In an embodiment, the conductive layer 202 may be referred to as a conductive ring, and is connected to the gates 202G and the stairs 202ST.

In an embodiment, the memory device 10 further includes a ground layer 106 disposed between the substrate 100 and the stacked structure 204a, wherein the channel structure VC further penetrates the ground layer 106.

In an embodiment, the memory device 10 further includes an insulating layer 104 disposed between the substrate 100 and the stacked structure 204b. In an embodiment, the memory device 10 further includes a plurality of stop patterns 103b disposed in the insulating layer 104, wherein the through via TV penetrates through one of the stop patterns 103b.

In an embodiment, the channel structure VC includes a dielectric pillar 126, a source pillar 200S, a drain pillar 200D, and a semiconductor layer 122a. The source pillar 200S and the drain pillar 200D are separated from each other by the dielectric pillar 126. The semiconductor layer 122a is disposed between the source pillar 200S and the corresponding gates 202G, and between the drain pillar 200D and the corresponding gates 202G. The semiconductor layer 122a may be referred to as a channel ring or a channel layer. In an embodiment, the semiconductor layer 122a is a continuous channel layer, which is disposed on the sidewalls of the gates 202G and the dielectric layers 107a, but the disclosure is not limited thereto. In another embodiment, the semiconductor layer 122a include discontinuous channel segments, which are merely disposed on the sidewalls of the gates 202G. A composite dielectric layer as a charge storage structure 201a is further disposed between the semiconductor layer 122a and the gates 202G.

In an embodiment, the memory device 10 further includes a dummy structure DV, which penetrates through the stacked structure 204b in the staircase region 100b and adjacent to the insulating pillar 130b. In an embodiment, the memory device 10 further includes an insulating layer 104 disposed between the substrate 100 and the stacked structure 204b. In an embodiment, the memory device 10 further includes a plurality of stop patterns 103b disposed in the insulating layer 104, wherein the dummy structure DV does not penetrate one of the stop patterns 103b. More specifically, the dummy structure DV is landed on one of the stop patterns 103b.

In an embodiment, the dummy structure DV includes an isolation pillar 124b, and a semiconductor layer 122b surrounding the sidewall of the isolation pillar 124b. The semiconductor layer 122b may be called a semiconductor ring, and is connected to a stair protection layer 201b.

In an embodiment, the dimension of the channel structure VC is substantially equal to the dimension of the dummy structure DV. In an embodiment, the dimension of the channel structure VC is not equal to the dimension of the dummy structure DV.

In an embodiment, the memory device 10 further includes an insulating wall 130a, which penetrates the stacked structure 204a in the memory array region 100a and adjacent to the channel structure VC. In an embodiment, the insulation wall 130b formed in the trench SLT further extends into the staircase region 100b, as shown in FIG. 11 and FIG. 13.

To sum up, the present disclosure provides a memory device and a forming method thereof, in which a trench for a replacement process and a hole for a through via can be simultaneously defined, and the trench and the hole are then filled with a single oxide layer to form an insulating wall and an insulating pillar respectively, and a via is subsequently formed through the insulating pillar. The simultaneous trench/hole definition step described above can simplify the manufacturing process. In addition, the single oxide layer can avoid the conventional short issue between the through via and the underlying interconnection structure caused by incomplete etching during the etching of a through via opening, so the reliability of the formed memory device can be improved.

Although the present disclosure has been disclosed above with the embodiments, it is not intended to limit the present disclosure. Anyone with ordinary knowledge in the technical field may make some changes and modifications without departing from the spirit and scope of the present disclosure. The scope of protection of the present disclosure should be defined by the scope of the appended patent application.

What is claimed is:

1. A memory device, comprising:
   a substrate having a memory array region and a staircase region;
   a first stacked structure disposed on the substrate in the memory array region, wherein the first stacked structure comprises a plurality of first dielectric layers and a plurality of gates stacked alternately;
   a second stacked structure disposed on the substrate in the staircase region, wherein the second stacked structure comprises a plurality of second dielectric layers and a plurality of stairs stacked alternately;
   a channel structure penetrating through the first stacked structure in the memory array region;
   an insulating pillar, penetrating through the second stacked structure in the staircase region;
   a through via penetrating through the insulating pillar in the staircase region; and
   a conductive layer surrounding a sidewall of the insulating pillar.

2. The memory device of claim 1, further comprising:
   a ground layer disposed between the substrate and the first stacked structure, wherein the channel structure penetrates through the ground layer.

3. The memory device of claim 1, further comprising:
   an insulating layer disposed between the substrate and the second stacked structure; and a plurality of stop patterns disposed in the insulating layer, wherein the through via penetrates through one of the stop patterns.

4. The memory device of claim 1, wherein the channel structure comprises:
a dielectric pillar;
a source pillar and a drain pillar separated from each other by the dielectric pillar; and
a first semiconductor layer disposed between the source pillar and the gates and between the drain pillar and the gates.

5. The memory device of claim 1, further comprising:
a dummy structure penetrating through the second stacked structure in the staircase region and adjacent to the insulating pillar.

6. The memory device of claim 5, further comprising:
an insulating layer disposed between the substrate and the second stacked structure; and
a plurality of stop patterns disposed in the insulating layer, wherein the dummy structure does not penetrate through one of the stop patterns.

7. The memory device of claim 5, wherein the dummy structure comprises:
an isolation pillar; and
a second semiconductor layer surrounding a sidewall of the isolation pillar.

8. The memory device of claim 5, wherein a dimension of the channel structure is substantially equal to a dimension of the dummy structure.

9. The memory device of claim 1, further comprising:
an insulating wall penetrating through the first stacked structure in the memory array region and adjacent to the channel structure.

10. The memory device of claim 9, wherein the insulating wall further extends to the staircase region.

11. A method of forming a memory device, comprising:
providing a substrate, wherein the substrate has a memory array region and a staircase region;
forming a stacked structure on the substrate, wherein the stacked structure comprises a plurality of dielectric layers and a plurality of intermediate layers stacked alternately, and the stacked structure in the staircase region has a stepped profile;
forming a ground layer between the substrate and the stacked structure;
forming a channel structure through the stacked structure in the memory array region, and forming a dummy structure through the stacked structure in the staircase region, wherein the channel structure penetrates through the ground layer;
forming a trench through the stacked structure in the memory array region, and forming a hole through the stacked structure in the staircase region;
replacing the plurality of intermediate layers in the memory array region with a plurality of gates, and replacing the plurality of intermediate layers in the staircase region with a plurality of stairs;
forming an insulating wall in the trench, and forming an insulating pillar in the hole; and
forming a through via in the staircase region, the through via penetrating through the insulating pillar.

12. The method of claim 11, wherein during the step of replacing the plurality of intermediate layers with the plurality of gates and the plurality of stairs, a conductive layer is further formed on sidewalls and bottoms of the trench and the hole.

13. The method of claim 12, further comprising:
forming an etching back process to remove the conductive layer on the bottoms of the trench and hole.

14. The method of claim 11, further comprising:
forming an insulating layer between the substrate and the stacked structure, wherein a plurality of stop patterns is formed in the insulating layer,
wherein the hole penetrates through one of the stop patterns.

15. The method of claim 11, further comprising:
forming an insulating layer between the substrate and the stacked structure, wherein a plurality of stop patterns is formed in the insulating layer,
wherein the dummy structure does not penetrate through one of the stop patterns.

16. The method of claim 11, wherein the step of forming the channel structure and the dummy structure comprises:
forming a channel structure hole penetrating through the stacked structure in the memory array region, and forming a dummy structure hole penetrating through the stacked structure in the staircase region;
forming the channel structure in the channel structure hole; and
forming the dummy structure in the dummy structure hole.

17. The method of claim 16, wherein the channel structure hole and the dummy structure hole are defined by the same photomask.

18. The method of claim 16, wherein a dimension of the channel structure hole is substantially equal to a dimension of the dummy structure hole.

19. The method of claim 11, wherein the trench and the hole are defined by the same photomask.

* * * * *